(12) United States Patent
Liu et al.

(10) Patent No.: US 10,784,412 B2
(45) Date of Patent: Sep. 22, 2020

(54) PACKAGE SUPPORT STRUCTURE AND LIGHT EMITTING DEVICE INCLUDING SAME

(71) Applicant: Everlight Electronics Co., Ltd., New Taipei (TW)

(72) Inventors: Chien-Nan Liu, New Taipei (TW); Teng-Wei Chen, New Taipei (TW); Chieh-Yu Kang, New Taipei (TW); Hao-Yu Yang, New Taipei (TW); Yu-Da Lee, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 46 days.

(21) Appl. No.: 16/020,172

(22) Filed: Jun. 27, 2018

(65) Prior Publication Data

US 2018/0374997 A1    Dec. 27, 2018

Related U.S. Application Data

(60) Provisional application No. 62/525,208, filed on Jun. 27, 2017, provisional application No. 62/613,056, filed on Jan. 3, 2018.

(51) Int. Cl.
*H01L 33/00* (2010.01)
*H01L 33/48* (2010.01)
(Continued)

(52) U.S. Cl.
CPC .......... *H01L 33/486* (2013.01); *G02B 6/009* (2013.01); *G02B 6/0073* (2013.01); *H01L 33/62* (2013.01);
(Continued)

(58) Field of Classification Search
CPC ..... H01L 33/62; H01L 33/486; H01L 33/642; H01L 33/647; G02B 6/0073
See application file for complete search history.

(56) References Cited

U.S. PATENT DOCUMENTS

| 8,164,825 B2 | 4/2012 | Narendran et al. |
| 8,269,411 B2 | 9/2012 | Yu et al. |

(Continued)

*Primary Examiner* — Phuc T Dang
(74) *Attorney, Agent, or Firm* — Chen Yoshimura LLP

(57) ABSTRACT

The present invention provides a package support structure and a light emitting device including same. The package support structure includes: a housing which comprises a light emitting surface, a backlight surface, a bottom surface and a groove; a conductive support which is partially covered by the housing and includes a first lead and a second lead that are separated from each other, where each of the first lead and the second lead includes an electrode portion and a bent portion, the electrode portion is exposed from the housing through the groove, and the bent portion extends outward from the electrode portion beyond the housing and bends toward the bottom surface of the housing; where one of the first lead and the second lead further includes a heat radiation portion, the heat radiation portion extend outward from the electrode portion and is exposed from the backlight surface of the housing. The package support structure provided in the present invention achieves the effect of reducing an upper piece error and the purpose of effectively removing the heat energy.

15 Claims, 10 Drawing Sheets

(51) Int. Cl.
  *H01L 33/62*    (2010.01)
  *F21V 8/00*     (2006.01)
  *H01L 33/64*    (2010.01)
  *H01L 33/50*    (2010.01)

(52) U.S. Cl.
  CPC .......... *H01L 33/647* (2013.01); *H01L 33/507* (2013.01); *H01L 33/508* (2013.01); *H01L 33/642* (2013.01); *H01L 33/644* (2013.01)

(56) References Cited

U.S. PATENT DOCUMENTS

| | | | |
|---|---|---|---|
| 9,287,477 B2 | 10/2016 | Anc | |
| 9,466,771 B2 | 10/2016 | Anc | |
| 2009/0189175 A1* | 7/2009 | Park | H01L 33/486 257/99 |
| 2009/0315068 A1* | 12/2009 | Oshio | H01L 33/647 257/103 |
| 2011/0108866 A1* | 5/2011 | Lee | H01L 33/486 257/98 |
| 2011/0175119 A1* | 7/2011 | Kim | H01L 33/483 257/91 |
| 2012/0211789 A1* | 8/2012 | Lee | H01L 33/486 257/98 |
| 2013/0049565 A1* | 2/2013 | Jung | H01L 33/62 313/45 |
| 2013/0320373 A1* | 12/2013 | Pu | F21V 21/00 257/98 |
| 2015/0171282 A1* | 6/2015 | Wakaki | H01L 33/486 257/99 |
| 2016/0161736 A1* | 6/2016 | Chou | G02B 26/008 362/324 |

* cited by examiner

PACKAGE SUPPORT STRUCTURE AND LIGHT EMITTING DEVICE INCLUDING SAME

TECHNICAL FIELD

The present invention relates to the field of light emission, and in particular to a package support structure and a light emitting device including the package support structure.

BACKGROUND

More and more displays for current electronic products are equipped with light emitting diodes (LED) as light emitting elements, and the light emitted by the LED can be evenly emitted from the panel of the display via components such as a light guide plate. More specifically, an LED is first disposed in a package structure which is then disposed on a substrate, and a light incident surface of the light guide plate is aligned with the LED, so that the light emitted by the LED enters the light guide plate as far as possible, thereby reducing the occurrence of light leakage. Therefore, if the LED is not aligned with the light guide plate accurately, the light leakage will be caused, resulting in poor display effects and decreased brightness for the display. In addition, in order to allow the light of the LED to enter the light guide plate intensively, the height of the LED light emitting region may be adjusted as required accordingly; in order to smoothly transfer the heat generated by the LED to the outside, it is necessary to consider the design of the support and minimize the possible thermal resistance. For example, traditionally, the thickness of the support may be increased to reduce the thermal resistance.

Known factors that affect the accuracy of alignment between the package structure and the light guide plate may include: when the package structure is disposed on the substrate (or referred to as an upper piece), solder (solder paste) between the package structure and the substrate may cause displacement of the package structure relative to the substrate, thereby causing the position of the package structure on the substrate to exceed a set value (exceed a tolerance range); this phenomenon can also be referred to as an upper piece error or component shifted (component shifted).

On the other hand, heat generated from an operation of the LED often affects the luminous efficiency of the LED, resulting in that light emitted by the LED fails to meet expectations.

In view of this, how to improve the above-mentioned defects is a problem for the industry to solve.

SUMMARY

In view of the above problem, a purpose of the present invention is to provide a package support structure and a light emitting device including same, which can improve an upper piece error between the package support structure and a substrate, or make the package support structure have a better heat radiation capability.

The present invention provides a package support structure in order to achieve the above purpose, the package support structure includes:

a housing which includes a light emitting surface, a backlight surface, a bottom surface and a groove, where the light emitting surface is disposed opposite to the backlight surface, the bottom surface is disposed between the light emitting surface and the backlight surface, and the groove is formed on the light emitting surface and defines an opening on the light emitting surface, the housing further including a top surface disposed opposite to the bottom surface, wherein a distance between the opening of the groove and the top surface is less than a distance between the opening of the groove and the bottom surface; and a conductive support which is partially covered by the housing and includes a first lead and a second lead that are separated from each other, where each of the first lead and the second lead includes an electrode portion and a bent portion, the electrode portion is exposed from the housing through the groove, and the bent portion extends outward from the electrode portion beyond the housing and bends toward the bottom surface of the housing;

where one of the first lead and the second lead further includes a heat radiation portion, the heat radiation portion extends outward from the electrode portion and is exposed from the backlight surface of the housing.

Preferably, the housing further includes two side faces, the two side faces are disposed between the light emitting surface and the backlight surface, and the bottom surface is disposed between the two side faces; where the bent portion extends outward through the side faces beyond the housing and bends toward the side faces and the bottom surface.

Preferably, the bent portion extends outward from the heat radiation portion, such that the bent portion indirectly extends outward from the electrode portion. The top surface of the housing is disposed opposite to the bottom surface of the housing. At least one of the two side faces includes a top side face portion and a bottom side face portion, where the top side face portion is connected to the top surface of the housing, and the bottom side face portion is connected to the bottom surface of the housing. The top side face portion and the bottom side face portion are not aligned with each other, and the bottom side face portion is recessed relative to the top side face portion. An outer side of the bent portion is disposed outside of the bottom side face portion and is aligned with the top side face portion.

Preferably, the heat radiation portion and the bent portion extend outward from opposite sides of the electrode portion, respectively.

Preferably, the housing further includes at least one supporting portion, and the supporting portion is formed on the bottom surface; where the thickness of the supporting portion in a normal direction of the bottom surface is less than or equal to the thickness of the bent portion.

Preferably, one of the first lead and the second lead further includes a sub-bent portion, the sub-bent portion extends outward from the electrode portion beyond the housing and bends toward the bottom surface of the housing; where the sub-bent portion is disposed between the bent portion of the first lead and the bent portion of the second lead.

Preferably, there is a gap between the first lead and the second lead, and the width of the gap is variable.

Preferably, an exposed surface of the heat radiation portion exposed on the backlight surface is aligned with the backlight surface.

The prevent invention also provides a light emitting device, including:

a package support structure which includes a housing and a conductive support, where the housing includes a light emitting surface, a backlight surface, a bottom surface and a groove, the light emitting surface is disposed opposite to the backlight surface, the bottom surface is disposed between the light emitting surface and the backlight surface, and the groove is formed on the light emitting surface, and wherein the conductive support is partially covered by the housing and includes a first lead and a second lead that are separated from each other, each of the first lead and the second lead includes an electrode portion and a bent portion, the electrode portion is exposed from the housing through the groove, and the bent portion extends outward from the electrode portion beyond the housing and bends toward the bottom surface of the housing, one of the first lead and the second lead further includes a heat radiation portion, the heat radiation portion extends outward from the electrode portion and is exposed from the backlight surface of the housing;

a substrate which includes a surface and a plurality of pads disposed on the surface, where the package support structure is disposed on the surface, and the bottom surface of the housing faces the surface, the bent portion of the first lead and the bent portion of the second lead are electrically connected to the pads, respectively;

a light emitting element which is disposed in the groove of the housing and is electrically connected to the electrode portion of the first lead and the electrode portion of the second lead; and a heat sink which is disposed on the surface and is connected to the heat radiation portion of the conductive support.

Preferably, the light emitting device further includes a package colloid filled in the groove, where the package colloid covers the light emitting element, and a quantum dot material and a phosphor material are distributed in the package colloid.

Preferably, the quantum dot material and the phosphor material, after being subjected to an inverted centrifugation in the package colloid, are distributed in an end of the package colloid away from the light emitting element.

Preferably, the substrate further includes a supporting structure which is formed on the surface to support the light emitting surface of the housing.

Preferably, the supporting structure is an accommodating slot or a supporting block.

The package support structure and the light emitting device of the present invention can at least provide the following beneficial effects:

1. The package support structure is disposed on the surface of the substrate through the bent portions, so that the normal direction of the light emitting surface of the package support structure (i.e., the light emitting direction) is intersected with (or perpendicular to) the normal direction of the surface of the substrate (i.e., an upper piece direction), thus the package support structure can be used for side light emitting. In addition, the bent portion of the package support structure has a smaller solder contact surface, thus the package support structure is less likely subject to a displacement due to solder, so that an effect of upper piece error reduction can be achieved.

2. Since the heat radiation portion of the conductive support is exposed outside the housing, it may be connected with an external heat sink so that the heat energy generated by the light emitting element (such as a light emitting diode) can be dissipated more quickly to reduce or avoid an efficacy reduction of the light emitting element resulting from high temperature. Therefore, even if the solder contact surface is decreased, the package support structure can effectively remove the thermal energy.

3. Since the bent portion has better structural strength after twice bent, when an external force acts on the package support structure provided on the substrate, it is not easy to break or deform the bent portion. In addition, the force on the bent portion can be shared by the sub-bent portion, so that the bent portion is less likely to be broken or deformed.

In order to make the above purpose, technical features and advantages more obvious and understandable, the following is a detailed description in light of the preferred embodiments in combination with the accompanying drawings.

BRIEF DESCRIPTION OF DRAWINGS

In order to more clearly illustrate technical solutions in embodiments of the present invention or in the prior art, the following will briefly describe the drawings required for the description of the embodiments or the prior art. Obviously, the drawings in the following description are some embodiments of the present invention. For those skilled in the art, other drawings may also be obtained based on these drawings without any creative effort.

| Explanation to reference signs: | | |
|---|---|---|
| 1-package support structure | 10-housing | 11-light emitting surface |
| 12-backlight surface | 13-bottom surface | 14-groove |
| 15-side face | 16-supporting portion | 20-conductive support |
| 21-first lead | 22-second lead | 23-electrode portion |
| 24-bent portion | 25-heat radiation portion | 251-exposed surface; |
| 26-sub-bent portion | 27-gap | 2-light emitting device |
| 3-substrate | 31-surface | 32-pad |
| 33-supporting structure | 331-accommodating slot | 332-supporting block |
| 4-heat sink | 5-light guide plate | 51-light incoming side |
| 6-light emitting element | 7-package colloid | 71-phosphor material |
| 72-quantum dot material | 200-metal plate | |

DESCRIPTION OF EMBODIMENTS

To make purposes, technical solutions, and advantages of the embodiments of the present invention clearer, the technical solutions in the embodiments of the present invention will be described hereunder clearly and comprehensively with reference to the accompanying drawings in the embodiments of the present invention. Obviously, the described embodiments are a part rather than all of the embodiments of the present invention. All other embodiments obtained by a person of ordinary skill in the art based on the embodiments of the present invention without any creative effort shall fall into the protection scope of the present invention.

Figure 1A:
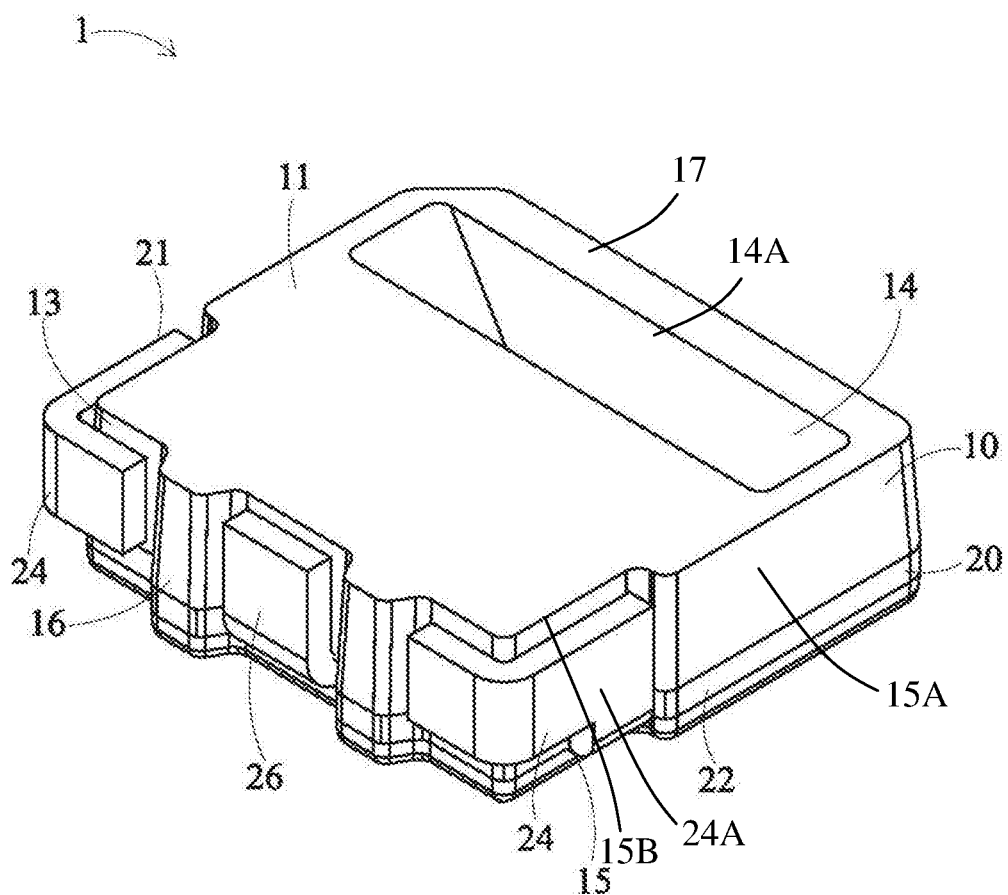
FIG. 1A is a perspective schematic structural diagram of a package support structure according to Embodiment I of the present invention.
Figure 1B:
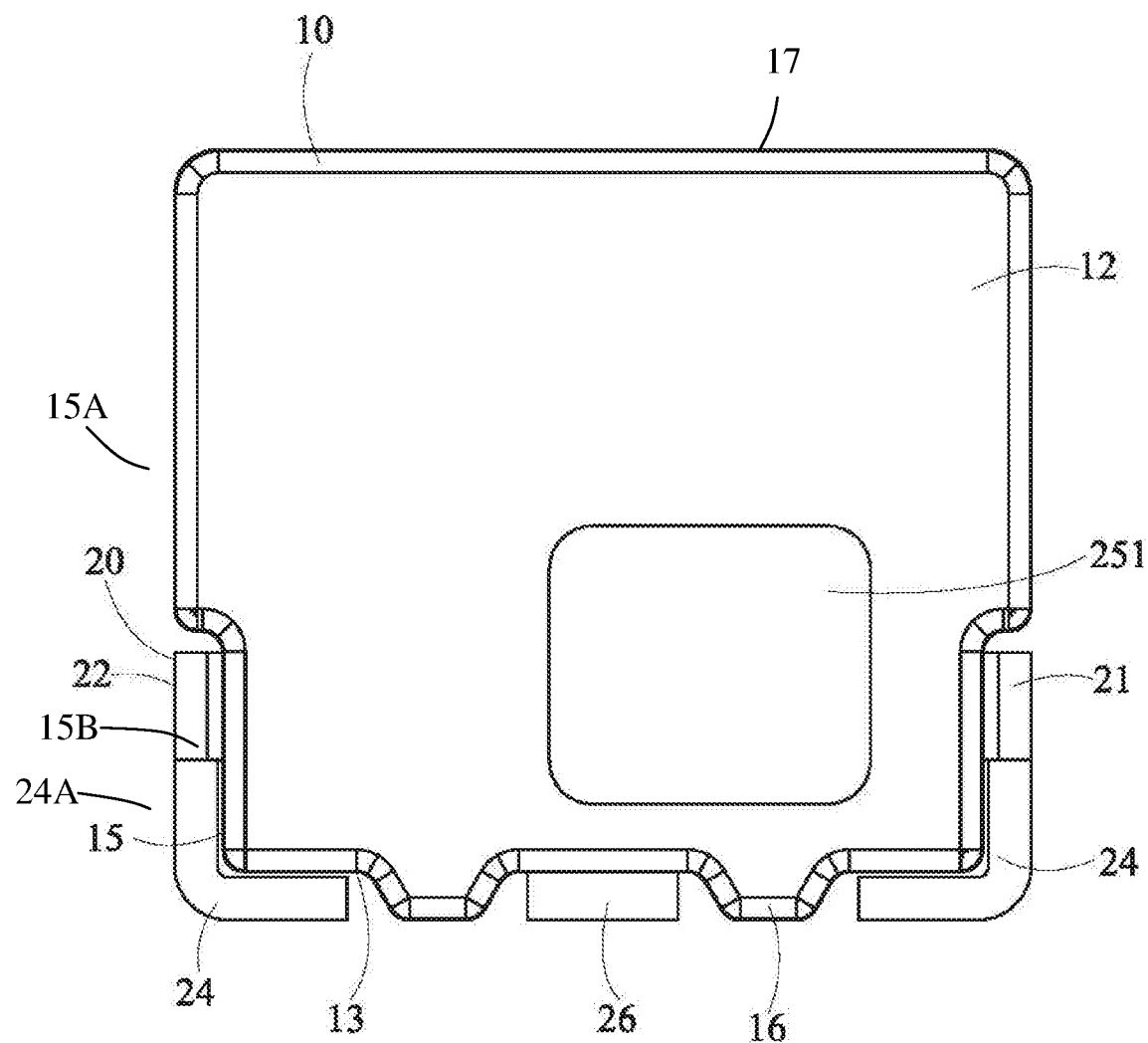
FIG. 1B is a schematic structural diagram of a backlight surface of a package support structure according to Embodiment I of the present invention.
Figure 1C:
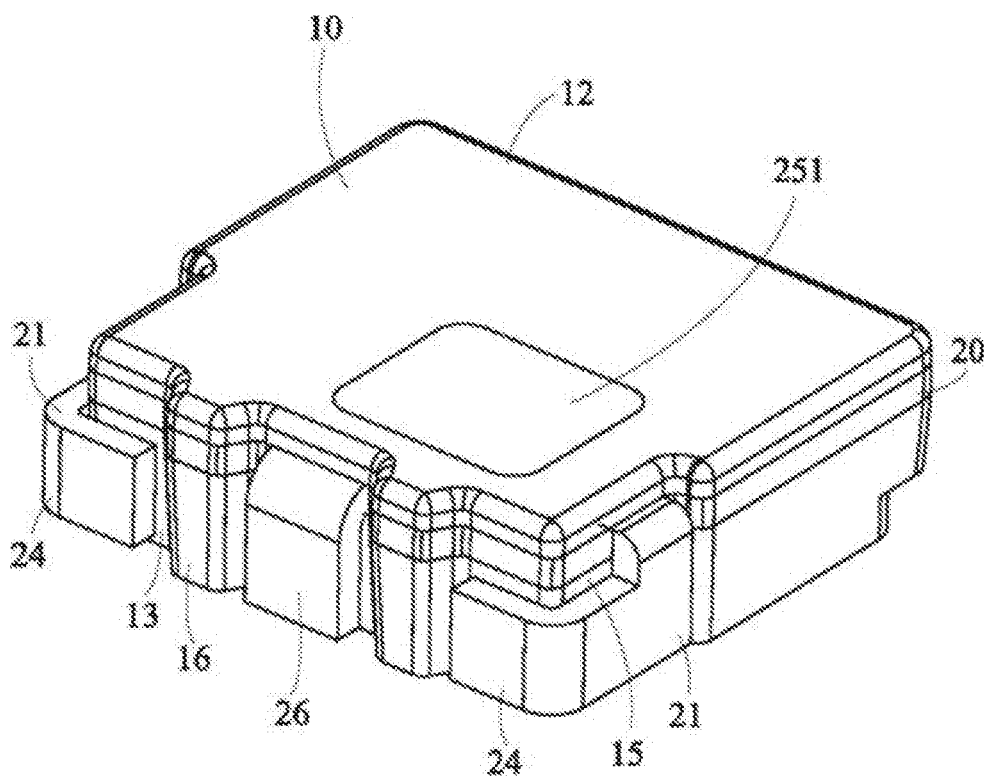
FIG. 1C is still another perspective schematic structural diagram of a package support structure according to Embodiment I of the present invention.
Figure 2A:
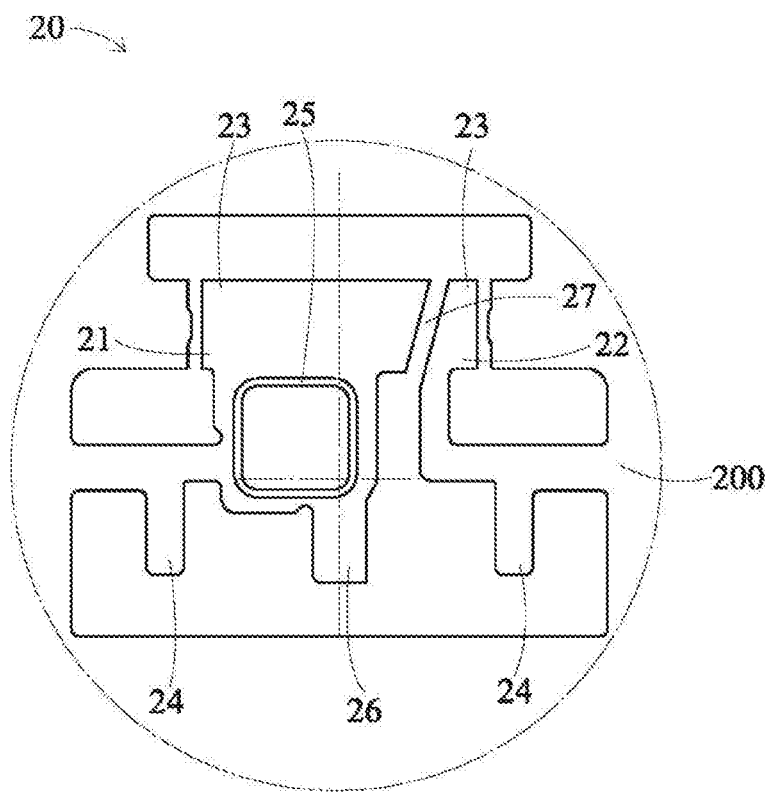
FIG. 2A is a schematic structural diagram of a conductive support in a package support structure according to Embodiment I of the present invention.
Figure 2B:
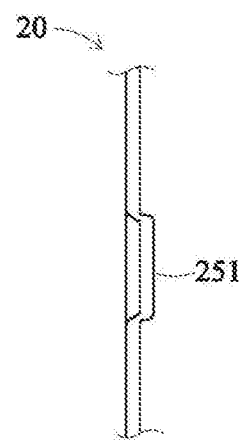
FIG. 2B is a schematic cross-sectional diagram of a conductive support in a package support structure according to Embodiment I of the present invention.
Figure 3A:
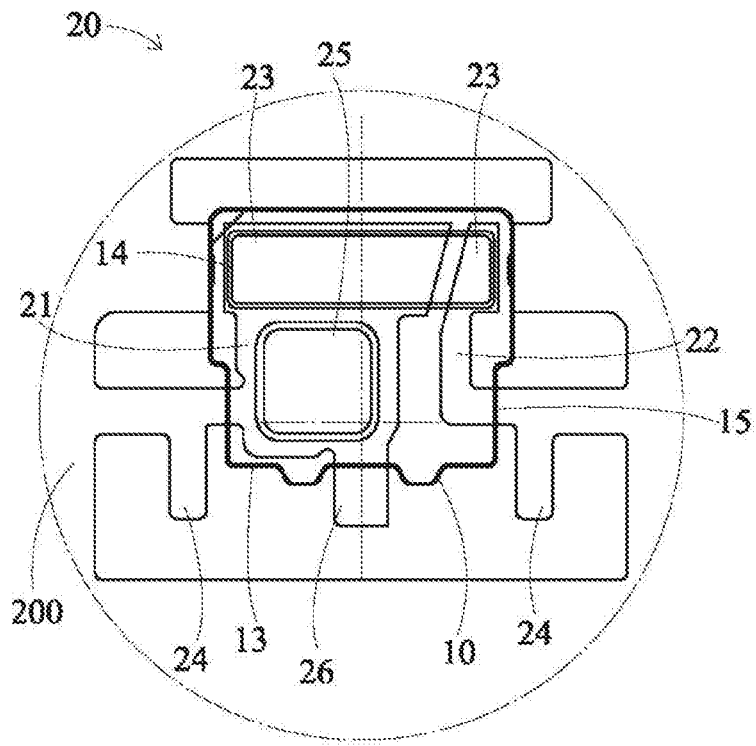
FIG. 3A is a schematic structural diagram of a conductive support and a housing in a manufacturing process of a package support structure according to Embodiment I of the present invention.
Figure 3B:
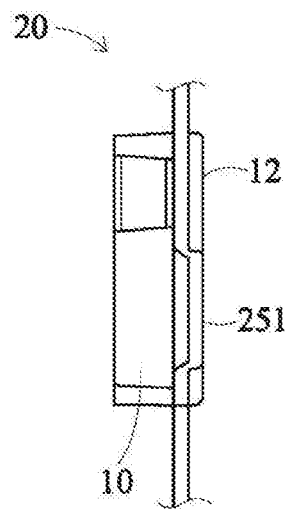
FIG. 3B is a schematic cross-sectional diagram of a conductive support and a housing in a manufacturing process of a package support structure according to Embodiment I of the present invention.
Figure 4A:
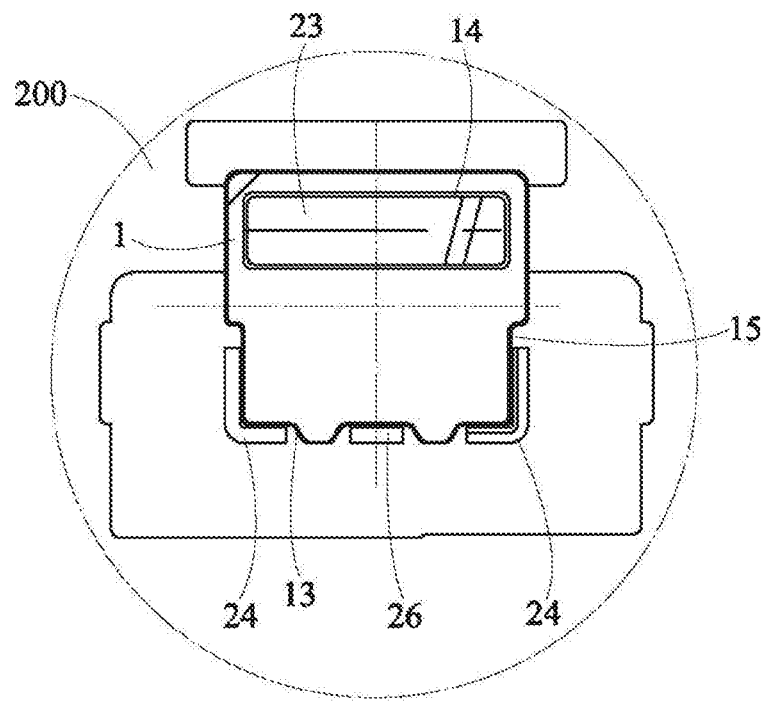
FIG. 4A is a schematic structural diagram of a conductive support and a housing upon completion of a package support structure according to Embodiment I of the present invention.
Figure 4B:
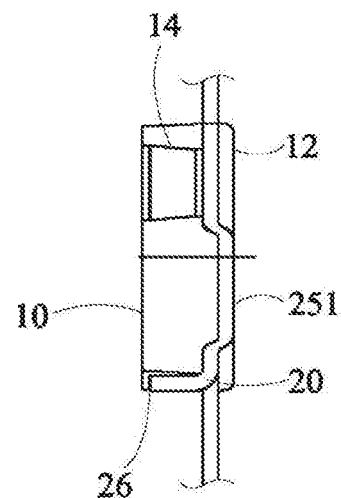
FIG. 4B is a schematic cross-sectional diagram of a conductive support and a housing upon completion of a package support structure according to Embodiment I of the present invention.
Figure 4C:
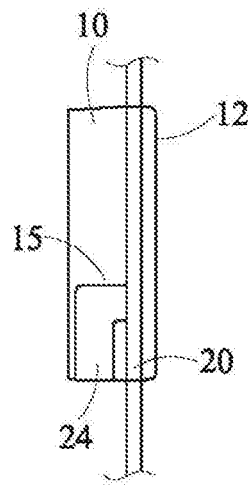
FIG. 4C is a schematic side diagram of a conductive support and a housing upon completion of a package support structure according to Embodiment I of the present invention.

FIG. 1A is a perspective schematic structural diagram of a package support structure according to Embodiment I of the present invention; FIG. 1B is a schematic structural diagram of a backlight surface of a package support structure according to Embodiment I of the present invention; FIG. 1C is still another perspective schematic structural diagram of a package support structure according to Embodiment I of the present invention; FIG. 2A is a schematic structural diagram of a conductive support in a package support structure according to Embodiment I of the present invention; FIG. 2B is a schematic cross-sectional diagram of a conductive support in a package support structure according to Embodiment I of the present invention; FIG. 3A is a schematic structural diagram of a conductive support and a housing in a manufacturing process of a package support structure according to Embodiment I of the present invention; FIG. 3B is a schematic cross-sectional diagram of a conductive support and a housing in a manufacturing process of a package support structure according to Embodiment I of the present invention; FIG. 4A is a schematic structural diagram of a conductive support and a housing upon completion of a package support structure according to Embodiment I of the present invention; FIG. 4B is a schematic cross-sectional diagram of a conductive support and a housing upon completion of a package support structure according to Embodiment I of the present invention; and FIG. 4C is a schematic side diagram of a conductive support and a housing upon completion of a package support structure according to Embodiment I of the present invention.

As shown in FIG. 1A to FIG. 1C, the package support structure 1 includes a housing 10 and a conductive support 20. The technical content of each component is described as below.

Figure 5:
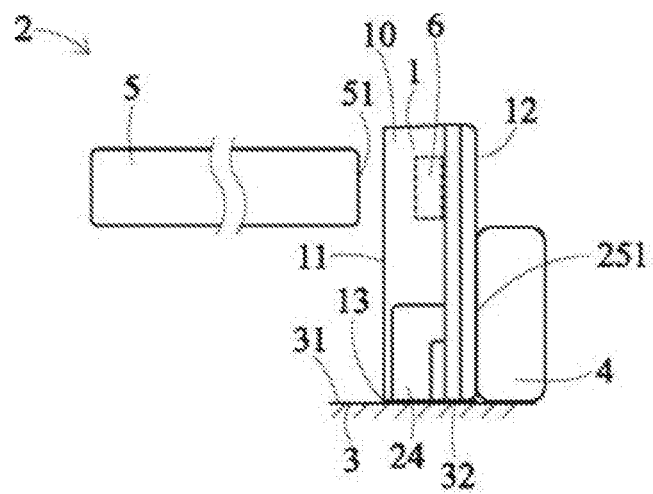
FIG. 5 is a schematic structural diagram of a light emitting device according to Embodiment II of the present invention.

The housing 10 may be formed of a commonly-used package material (a light-proof or light-shielding material) such as a thermosetting resin, a thermoplastic resin, PPA, PCT, and a polymer resin, where a reflective material and a heat radiation material, such as $TiO_2$ or $SiO_2$, may be added to the resin; the structure of the housing 10 is substantially a cube, and may include a light emitting surface 11, a backlight surface 12, a bottom surface 13, a groove 14, and two side faces 15; where the light emitting surface 11 represents a surface of the later-described light emitting element 6 (as shown in FIG. 5) from which light is emitted, thus the normal direction of the light emitting surface 11 may be defined as a light emitting direction of the light emitting element 6; the light emitting surface 11 is disposed opposite to the backlight surface 12, so the normal direction of the backlight surface 12 is opposite to the light emitting direction, and the light should not be emitted from the backlight surface 12. Preferably, the light emitting surface 11 and the backlight surface 12 can be on the same plane and are parallel.

Both the bottom surface 13 and the two side faces 15 are connected to the light emitting surface 11 and the backlight surface 12, and are disposed between the light emitting surface 11 and the backlight surface 12. The bottom surface 13 is further disposed between the two side faces 15. In other words, one of the side faces 15, the bottom surface 13 and the other one of the side faces 15 are formed along an edge of the light emitting surface 11 and an edge of the backlight surface 12 in order and are clamped between the light emitting surface 11 and the backlight surface 12. Preferably, the bottom surface 13 and the side faces 15 can be perpendicular to the light emitting surface 11 and the backlight surface 12. In addition, the bottom surface 13 and the two side faces 15 can be non-planar but have some segment gaps or a structure such as chamfers. A top surface 17 of the housing 10 is disposed opposite to the bottom surface 13 of the housing 10. The side face 15 has a top side face portion 15A and a bottom side face portion 15B, where the top side face portion is connected to the top surface 17 of the housing 10, and the bottom side face portion is connected to the bottom surface 13 of the housing 10. The top side face portion 15A and the bottom side face portion 15B are not aligned with each other; the bottom side face portion is recessed relative to the top side face portion.

The groove 14 is formed on the light emitting surface 11 in a concave manner, and the bottom of the groove 14 has an opening 14A to expose the electrode portion 23 of the conductive support 20 which will be described later. Preferably, a side of the groove 14 is inclined with respect to the light emitting surface 11 so that more light can be emitted from the light emitting surface 11, i.e., the light extraction efficiency is improved. The groove 14 may be filled with a resin, where a phosphor powder may be added to the resin to change the wavelength (color) of the light. In addition, preferably, the housing 10 further includes at least one supporting portion 16, for example, there may be two supporting portions 16 which are formed on the bottom surface 13 in a protruding manner. Preferably, the bottom surface of the supporting portion is aligned with the bottom surface of the bent portion, which assists the bending forming of the bent portion 24 or the sub-bent portion 26 to be described later, and it is also possible to increase the structural stability (because it is possible that the supporting portion 16 would contact the surface 31 of the substrate 3) of the package support structure 1 and the later-described substrate 3 (as shown in FIG. 5). Preferably, the total area of the bottom surface of the supporting portion 16 may be smaller than the total area of the bottom surface of the sub-bent portion 26 so as to increase the heat radiation area of the lead and assist the stability of the combination of the package support structure and the later-described substrate. In addition, the surface area of the light emitting surface 11 is larger than the surface area of the opening 14A of the groove 14, and the groove 14 is disposed adjacent the top surface 17 of the housing (i.e., the surface opposite to the bottom surface 13 of the housing), i.e., the distance between the opening 14A of the groove 14 and the top surface 17 of the housing 10 is less than the distance between the opening and the bottom surface 13 of the housing 10, so that the groove can be effectively tightly engaged with the light guide plate 5 to avoid light leakage.

As for the conductive support 20, it can be formed by stamping, punching or bending a metal plate (such as pure metal, alloy, metal composite laminate, etc.). As shown in FIG. 2A to FIG. 2B, the conductive support 20 has not yet been separated from the metal plate 200. The conductive support 20 is partially covered by the housing 10 and thus is clamped by the housing 10. The conductive support 20 includes a first lead 21 and a second lead 22 that are separated from each other, so a gap 27 is formed between the first lead 21 and the second lead 22 (i.e., between sections at which the two leads face each other). In other words, the gap 27 is a depletion region formed by punching a specific portion of the metal plate 200 by a cutter. Preferably, the width of the gap 27 is variable, that is, the gap 27 may be designed to include a first gap and a second gap, and the first gap and the second gap may be connected to each other. The first gap may be disposed and exposed at the bottom of the groove, and the second gap may be disposed within the housing and covered by the resin material of the housing; where the first gap has a first width and the second gap has a second width greater than the first width, whereby, because the width of the first gap is smaller, a portion of the first and second leads adjacent to the first gap can be stably fixed, so it is suitable to serve as a region where chip is fixed and wire binding is performed. On the other hand, the width of the second gap is larger, and more resin materials may be filled in the second gap to absorb the vibration caused by die bonding and wire bonding in the process. In this way, the thickness of the cutter is also correspondingly variable (or multiple cutters with different thicknesses but short lengths). Compared to a single cutter with a uniform thickness and a thin and long shape, a cutter with a variable thickness (or a non-slender cutter) may have better structural strength to increase the service life of the cutter.

Reference may be made to FIG. 2A to FIG. 2B, each of the first lead 21 and the second lead 22 includes an electrode portion 23 and a bent portion 24. Where the electrode portion 23 is farther from the bottom surface 13 of the housing 10 and is exposed from the housing 10 through the groove 14, so that the light emitting element 6 is electrically connected to the electrode portion 23 when being disposed in the groove 14. The electrode portion 23 of the first lead 21 may be greater than the electrode portion 23 of the second lead 22 in terms of area so as to form the heat radiation portion 25 to be described later. In addition, the gap 27 between the electrode portions 23 may have a smaller width. The bent portion 24 extends outward from the electrode portion 23 and is integrally molded with the electrode portion 23. In addition, the outer side 24A of the bent portion 24 is disposed outside of the bottom side face portion 15B and is aligned with the top side face portion 15A of the outer side face 15 of the housing 10, so that the possibility of short circuit can be reduced by subsequently reducing the diffusion area of the pad 32 (as shown in FIG. 5). The area of the outer side of the bent portion 24 may also be greater than the side area of the bottom surface, so that excess solder existing between the bottom surface of the bent portion and the substrate 3 may be reduced to make the package support structure unable to be flat against the substrate 3.

Reference may be made to FIG. 3A to FIG. 3B. In the manufacturing process, after the housing 10 partially covers the conductive support 20, the bent portion 24 may extend from the side face 15 of the housing 10. Then, reference may be made to FIG. 4A to FIG. 4C, the bent portion 24 will be initially bent toward the side face 15 of the housing 10, and then the bent portion 24 which is initially bent may continue to bent again toward the bottom surface 13 of the housing 10 by leaning against the supporting part 16 formed on housing 10. That is, the bent portion 24 is bent twice in different directions to increase its structural strength; however, the bent portion 24 may also extend directly from the bottom surface 13 beyond the housing 10 and then bent toward the bottom surface 13 directly. In addition, the bent portion 24 is spaced from (not in contact with) the bottom surface 13 and/or the side faces 15 of the housing 10, but can also abut against and contact the bottom surface 13 and/or the side faces 15.

The bent portion 24 is used for a connection with the pad 32 (as shown in FIG. 5) of the substrate 3, and has a smaller solder contact surface (with a width not greater than the width of the bottom surface 13), so less solder is attached to the bent portion 24. While excess solder may extend into the gap between the bottom surface 13 and the bent portion 24 to form a buffer, which can also avoid the phenomenon that the package support structure cannot be flat against the substrate 3.

Preferably, in the present embodiment, one of the first lead 21 and the second lead 22 further includes a sub-bent portion 26. Taking the first lead 22 as an example, the sub-bent portion 26 extends outward from the electrode portion 23 beyond the bottom surface 13 of the housing 10 (as shown in FIG. 3A), the sub-bent portion 26 may also be bent toward the bottom surface 13 of the housing 10 by leaning against the supporting portion 16 (shown in FIG. 4A), so that the bent portion 26 is located between the two bent portions 24 (that is, between the two supporting portions 16) and is also located outside the bottom surface 13 of the housing 10. In addition, the bending direction of the sub-bent portion 26 may be perpendicular to that of the bent portion 24. Therefore, the bottom surface of the sub-bent portion 26 can also be aligned with that of the supporting portion 16. The sub-bent portion 26 is also used for a connection with the pad 32 (as shown in FIG. 5) of the substrate 3, which increases the connection area and the heat radiation area between the first lead 21 and the pad 32, thereby increasing the bonding strength between the package support structure 1 and the substrate 3. In addition, the sub-bent portion 26 can also choose whether to abut against and contact the bottom surface 13 and/or the side face 15. Similarly, the width of the sub-bent portion will also be smaller than the width of the bottom surface 13, thus it can also serve as a buffer area for excess solder.

In addition, along the normal direction of the bottom surface 13, the thickness of the supporting portion 16 in the normal direction of the bottom surface 13 should not be greater than (i.e., less than or equal to) the thickness of the bent portion 14 and the thickness of the sub-bent portion 26, so that the supporting portion 16 will not protrude beyond the bent portion 14 and the sub-bent portion 26, and a connection between the bent portion 14 and the substrate 3 as well as a connection between the sub-bent portion 26 and the substrate 3 will not be affected.

Reference may be made to FIG. 3A and FIG. 4B, in the present embodiment, one of the first lead 21 and the second lead 22 further includes a heat radiation portion 25. Taking the first lead 22 as an example, the heat radiation portion 25 also extends outward from the electrode portion 23, and then the bent portion 24 (sub-bent portion 26) extends from the heat radiation portion 25 beyond the housing 10. The extending direction of the bent portion 24 is opposite to the opening direction of the groove, and the heat radiation portion 25 may be designed as a concave part. In order to both increase heat radiation efficiency and reduce thermal resistance, the depth of the concave part of the heat radiation portion needs to be less than the depth of the groove; in other words, the heat radiation portion 25 is disposed between the electrode portion 23 and the bent portion 24, and the bent portion 24 extends outward indirectly from the heat radiation portion 25. Furthermore, the heat radiation portion 25 is also exposed toward the backlight surface 12 of the housing 10 with respect to the electrode portion 23. Therefore, the exposed surface 251 of the heat radiation portion 25 is not covered by the housing 10.

More specifically, the exposed surface 251 exposed by the heat radiation portion 25 may be aligned with (or more protruding than) the backlight surface 12, so that the exposed surface 251 may be connected to a heat sink (such as a heat conducting block, a fin or a fan, etc.). Therefore, the light emitting element 6 will usually be disposed on a lead provided with the heat radiation portion 25, and the heat generated by the light emitting element 6 can be rapidly dissipated through the exposed surface 251 of the heat radiation portion. In this way, the lead provided with the light emitting element 6 has lower thermal resistance relative to the other lead. In addition, as described above, the lead additionally includes at least two bent portions extending to the outer side or the bottom surface of the housing, and thus the heat radiation can also be increased to reduce the thermal resistance.

Moreover, in other embodiments, the heat radiation portion 25 and the sub-bent portion 26 may also be included in the second lead 22, or both the first lead 21 and the second lead 22 may include their respective heat radiation portions 25 and/or sub-bent portion 26. In addition, the electrode portion 23 may be disposed between the heat radiation portion 25 and the bent portion 24, so that the heat radiation portion 25 and the bent portion 24 extend outward from opposite sides of the electrode portion 23, respectively; at this point, the electrode portion 23 and the groove 14 are closer to the bottom surface 13 of the housing 10, and the heat radiation portion 25 is relatively further away from the bottom surface 13.

Embodiment II

Figure 6A:
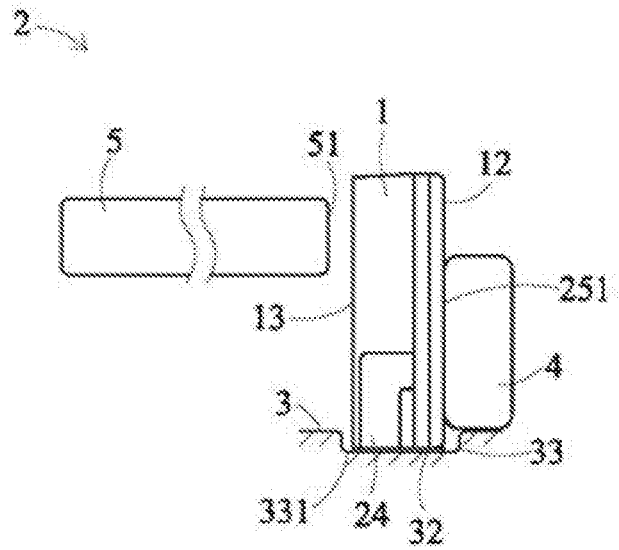
FIG. 6A to FIG. 6B are structural schematic diagrams illustrating a light emitting device when a substrate having a supporting structure is provide therein according to Embodiment II of the present invention.
Figure 6B:
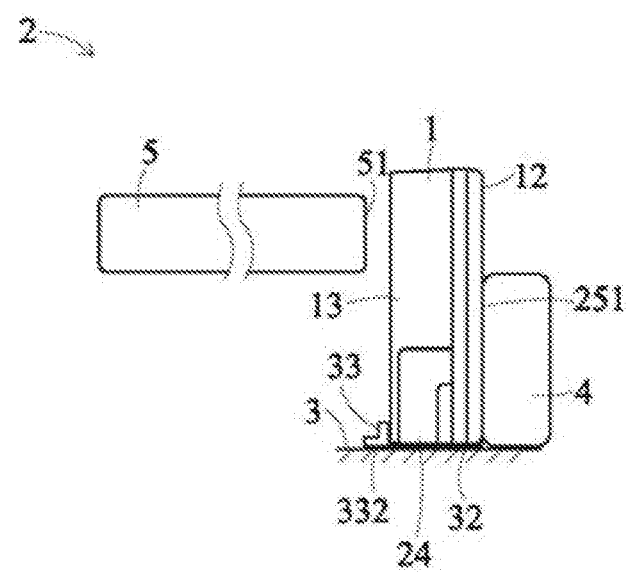
Figure 7A:
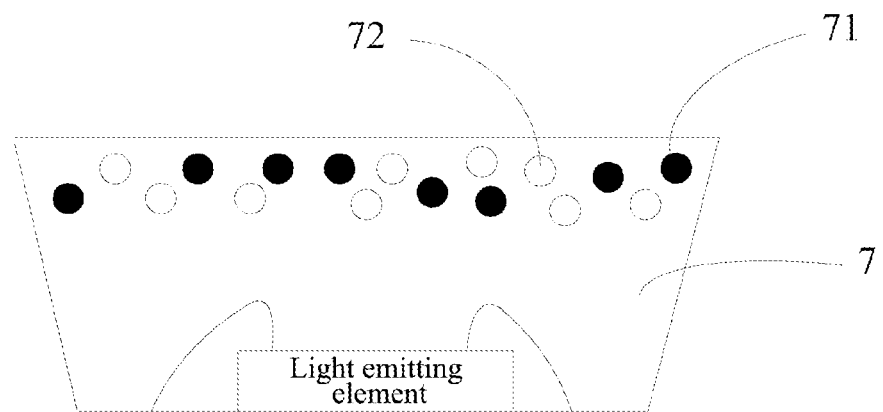
FIG. 7A is a schematic structural diagram after a quantum dot material and a phosphor material are subjected to an inverted centrifugation within an package colloid in a light emitting device according to Embodiment II of the present invention.
Figure 7B:
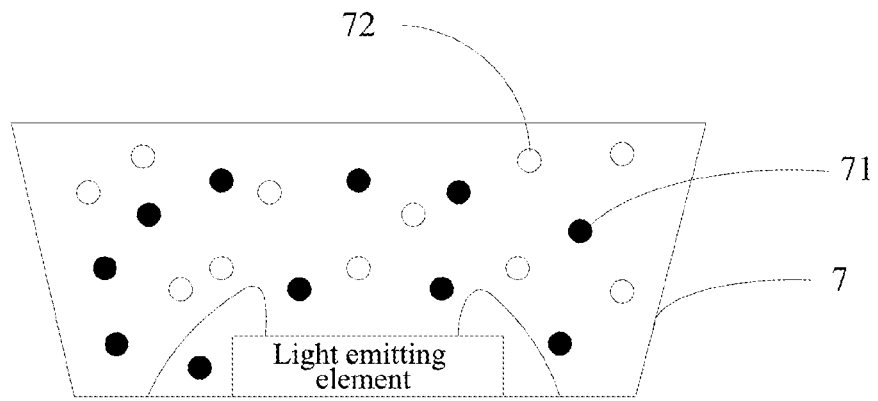
FIG. 7B is a schematic structural diagram when a quantum dot material and a phosphor material are uniformly distributed within a package colloid.
Figure 7C:
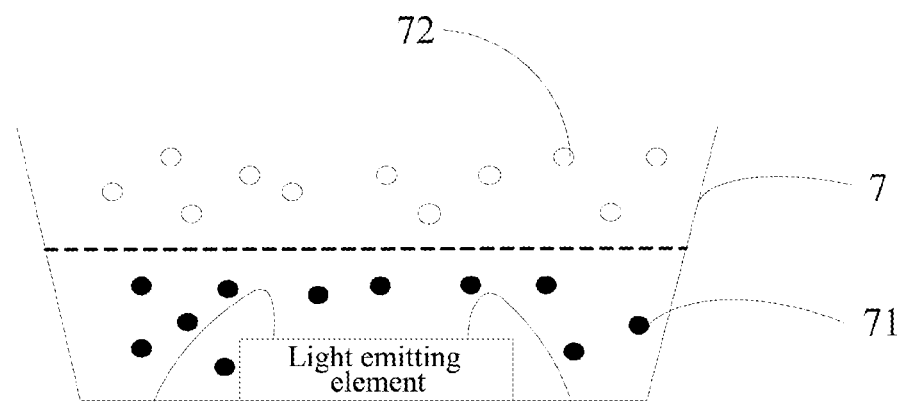
FIG. 7C is a schematic structural diagram when a quantum dot material and a phosphor material are distributed in layers within a package colloid.

FIG. 5 is a schematic structural diagram of a light emitting device according to Embodiment II of the present invention; FIG. 6A to FIG. 6B are structural schematic diagrams illustrating a light emitting device when a substrate having a support structure is provided therein according to Embodiment II of the present invention; FIG. 7A is a schematic structural diagram after a quantum dot material and a phosphor material are subjected to an inverted centrifugation within an package colloid in a light emitting device according to Embodiment II of the present invention; FIG. 7B is a schematic structural diagram when a quantum dot material and a phosphor material are uniformly distributed within a package colloid; FIG. 7C is a schematic structural diagram when a quantum dot material and a phosphor material are distributed in layers within a package colloid.

The above embodiment illustrates the technical contents of the package support structure 1, then an application example of the package support structure 1 will be illustrated, that is, a light emitting device 2 according to preferred embodiments of the present invention. For detailed technical contents of the package support structure 1, reference should be made to both of the cases, so the same parts will be omitted or simplified.

Reference may be made to FIG. 5, where the light emitting device 2 includes at least one package support structure 1 as described above, and further includes a substrate 3, a light emitting element 6, a heat sink 4, and a light guide plate 5. Technical contents of each component will be further described below.

The substrate 3 (such as a circuit board) includes a surface 31 and a plurality of pads 32 disposed on the surface 31. The package support structure 1 is disposed on the surface 31, and the bottom surface 13 of the housing 10 faces the surface 31. The bent portions 24 (sub-bent portion 26) located on the bottom surface 13 are welded to the pads 32, so that the bent portions 24 of the first lead 21 and the second lead 22 are electrically connected to the pads 32, respectively; solder (solder paste, not shown in the drawing) is coated between the bent portion 24 and the solder pad 32. In addition, the normal direction of the light emitting surface 11 of the housing 10 is intersected with and perpendicular to the normal direction of the surface 31.

In order to improve the bonding strength between the package support structure 1 and the substrate 3, the substrate 3 further includes a supporting structure 33 formed on the surface 31 to support the light emitting surface 11 of the package support structure 1. Specifically, the supporting structure 33 may be an accommodating slot 331 (as shown in FIG. 6A), or the supporting structure 33 may give a supporting force to the light emitting surface 11 in a form of a supporting block 332 (as shown in FIG. 6B).

In addition, the light emitting element 6 is disposed in the groove 14 (as shown in FIG. 1B) of the housing 10 and is electrically connected with the electrode portion 23 of the first lead 21 and the electrode portion 23 of the second lead 22 (as shown in FIG. 1B) via the groove 14, so that the light emitting element 6 may form a conductive path with the outside by sequentially passing through the electrode portion 23 of the conductive support 20, the bent portion 24, and the pad 32 of the substrate 3.

As for the heat sink 4, it is disposed on the surface 31 of the substrate 3 and is connected to the heat radiation portion 25 of the conductive support 20. Preferably, the exposed surface 251 of the heat radiation portion 25 in contact with the heat sink 4 is coated with thermal grease, so that the contact surface has a better thermal conductivity, thereby improving the heat radiation efficiency.

Moreover, in a specific embodiment, a single heat sink 4 corresponds to a single package support structure 1 and is connected to the heat radiation portion 25 to perform its heat radiation mechanism; while in other embodiments, a single heat sink 4 may also correspond to multiple package support structures 1 simultaneously and is thermally connected to the heat radiation portions 25 of the package support structures 1 respectively.

As for the light guide plate member 5, it is also disposed on the surface 31 of the substrate 3 and includes a light incoming side 51. The position of the light incoming side 51 just corresponds to the groove 14 of the housing 10 containing the light emitting element 6, and the size of the light incoming side 51 is not less than that of the groove 14, so as to make the light emitted by the light emitting element 6 enter the light guide plate 5 from the light incoming side 51 as much as possible. The light can be transmitted in the light guide plate 5 and evenly emitted from the light emitting side of the light guide plate 5 to components such as a display panel (not shown in the drawing). The light guide plate 5 can also correspond to a plurality of package support structures 1 at the same time, and the light incoming side 51 is aligned with the grooves of the package support structures 1.

In conclusion, the package support structure and the light emitting device provided in the present invention may securely combine the package support structure and the substrate, and effectively reduce the upper piece error of the package support structure, thereby increasing the alignment accuracy between the light emitting element and the light guide plate, and meanwhile with the improvement to the heat radiation portion in such an arrangement, the luminous efficacy of the light emitting element is maintained since the heat radiation effect is affected by the reduction of the contact surface between the package support structure and the substrate.

The light emitting element 6 used in the present invention can emit a wavelength substantially ranging from 400 nm to 530 nm, and its manufacturing method is described as below. First, a multi-layer material structure is formed on a substrate by a metal organic chemical vapor deposition (MOCVD) or a similar deposition technique, which includes, for example, an N-type layer, a light emitting layer, a P-type layer, and a current diffusion layer. The N-type layer, the light emitting layer, and the P-type layer are, for example, GaN, AlGaN, InGaN, AlInGaN, or a similar compound composed of elements including any of Al, In, Ga, and N, which may grow on the substrate by virtue of a metalorganic chemical vapor deposition or a molecular beam epitaxy. The current diffusion layer 18 is composed of a metal having relatively low resistance (such as nickel, gold or an alloy thereof) or a transparent conductive oxide material. In general, the metal composite structure suitable for the current diffusion layer may include Ti, Al, Pt, Ni, Au, Pd, Co, Cr, Sn, Nd, or Hf, and the transparent conductive oxide material may include indium tin oxide, cadmium tin oxide, ZnO:Al, $ZnGa_2O_4$, $SnO_2$:Sb, $Ga_2O_3$:Sn, $AgInO_2$:Sn, $In_2O_3$:Zn, NiO, MnO, FeO, $Fe_2O_3$, CoO, CrO, $Cr_2O_3$, $CrO_2$, CuO, SnO, GaO, $RuO_2$, $Ag_2O$, $CuAlO_2$, $SrCu_2O_2$, $LaMnO_3$, PdO, etc.

The groove in the present invention is filled with a package colloid 7 which covers the light emitting element 6. In addition, a quantum dot (QD for short) material 72 and a phosphor material 71 are distributed in the package colloid 7. In this embodiment, when the quantum dot material 72 and the phosphor material 71 are distributed in the package colloid 7, specifically, the quantum dot material 72 and the phosphor material 71, after being subjected to an inverted centrifugation in the package colloid 7, are distributed in an end of the package colloid 7 away from the light emitting element 6, as shown in FIG. 7A, the quantum dot material 72 and the phosphor material 71, after being subjected to an inverted centrifugation, are suspended in the top end of the package colloid 7. In this embodiment, when the quantum dot material 72 and the phosphor material 71 are distributed in the package colloid 7, a specific manufacturing process is: first, the quantum dot material 72 and the phosphor material 71 are mixed in the package colloid 7, and the package colloid 7 is filled in the groove 14; then, an inverted centrifugation is performed in a centrifuge. The quantum dot material 72 and the phosphor material 71, after being subjected to the inverted centrifugation, are suspended in an end of the package colloid 7 away from the light emitting element 6.

In this embodiment, $SiO_2$ is selected as the quantum dot material 72, and the average particle size of $SiO_2$ is preferably 2 nm. Fluoride phosphor (KSF) is selected as the phosphor material 71. $SiO_2$ and KSF are distributed in the package colloid 7, the package colloid 7 is filled in the groove 14, and after the package colloid 7 is subjected to an inverted centrifugation, a temperature and humidity-variable test is conducted for the light emitting device (i.e., Sample 3). For comparison, as shown in FIG. 7B, the quantum dot material 72 and the phosphor material 71 are dispersed in the entire package colloid 7 without the inverted centrifugation, and after the package colloid 7 in FIG. 7B is filled in the groove 14, a temperature and humidity-variable test is conducted for the light emitting device (i.e., Sample 1). Simultaneously, as shown in FIG. 7C, the quantum dot material 72 and the phosphor material 71 in the package colloid 7 are layered, i.e., the package colloid 7 has a double-layer structure. After the package colloid 7 in FIG. 7C is filled in the groove 14, a temperature and humidity-variable test is also conducted for the light emitting device (i.e., Sample 2). Test results thereof are shown in the following table:

|  | ΔLM (T = 0 h) | ΔLM (T = 24 h) | ΔLM (T = 36 h) | ΔLM (T = 72 h) |
| --- | --- | --- | --- | --- |
| Sample 1 | 0% | −44.1% | −87.6% | −88.9% |
| Sample 2 | 0% | 15.9% | −51.8% | −67.4% |
| Sample 3 | 0% | −3.4% | −10.1% | −0.1% |

In the table, ΔLM is a Lumen variable value of the light emitting device. It can be seen from the table that, in this embodiment, compared with Sample 1 and Sample 2, after the package colloid 7 is subjected to the inverted centrifugation, all the ΔLMs of the light emitting device (i.e., Sample 3) within 0-72 h are relatively small, that is, in the light emitting device provided in this embodiment, when the quantum dot material 72 and the phosphor material 71 subjected to the inverted centrifugation are distributed in the end of the package colloid 7 away from the light emitting element 6, the luminous attenuation of the light emitting device within 0-72 h is relatively small. Therefore, for the light emitting device provided in this embodiment, the reliability (RA) of the light emitting device is greatly improved when the quantum dot material 72 and the phosphor material 71 subjected to the inverted centrifugation are distributed in an end of the package colloid 7 away from the light emitting element 6.

In this embodiment, the phosphor material may also be selected from one or more of the group consisted of: $(Sr,Ba)Si_2(O,Cl)_2N_2:Eu^{2+}$, $Sr_5(PO4)_3Cl:Eu^{2+}$, $(Sr,Ba)MgAl_{10}O_{17}:Eu^{2+}$, $(Sr,Ba)_3MgSi_2O_8:Eu^{2+}$, $SrAl_2O_4:Eu^{2+}$, $SrBaSiO_4:Eu^{2+}$, CdS:In, $CaS:Ce^{3+}$, $(Y,Lu,Gd)_3(Al,Ga)_5O_{12}:Ce^{3+}$, $Ca_3Sc_2Si_3O_{12}:Ce^{3+}$, $SrSiON:Eu^{2+}$, $ZnS:Al^{3+},Cu^+$, CaS:$Sn^{2+}$, CaS:$Sn^{2+}$,F, $CaSO_4$:$Ce^{3+}$,$Mn^{2+}$, $LiAlO_2$:$Mn^{2+}$, $BaMgAl_{10}O_{17}$:$Eu^{2+}$,$Mn^{2+}$, ZnS:$Cu^+$,$Cl^-$, $Ca_3WO_6$:U, $Ca_3SiO_4Cl_2$:$Eu^{2+}$, $Sr_xBa_yClzAl_2O_{4-z/2}$:$Ce^{3+}$,$Mn^{2+}$ (X: 0.2, Y: 0.7, Z: 1.1), $Ba_2MgSi_2O_7$:$Eu^{2+}$, $Ba_2SiO_4$:$Eu^{2+}$, $Ba_2Li_2Si_2O_7$:$Eu^{2+}$, ZnO:S, ZnO:Zn, $Ca_2Ba_3(PO_4)_3Cl$:$Eu^{2+}$, $BaAl_2O_4$:$Eu^{2+}$, $SrGa_2S_4$:$Eu^{2+}$, ZnS:$Eu^{2+}$, $Ba_5(PO_4)_3Cl$:U, $Sr_3WO_6$:U, $CaGa_2S_4$:$Eu^{2+}$, $SrSO_4$:$Eu^{2+}$,$Mn^{2+}$, ZnS:P, ZnS:$Mn^{2+}$, CaS:$Yb^{2+}$,Cl, $Gd_3Ga_4O_{12}$:$Cr^{3+}$, $CaGa_2S_4$:$Mn^{2+}$, Na(Mg,Mn)$_2LiSi_4O_{10}F_2$:Mn, ZnS:$Sn^{2+}$, $Y_3Al_5O_{12}$:$Cr^{3+}$, $SrB_8O_{13}$:$Sm^{2+}$, $MgSr_3Si_2O_8$:$Eu^{2+}$,$Mn^{2+}$, $\alpha$-$SrO\cdot 3B_2O_3$:$Sm^{2+}$, ZnS—CdS, ZnSe:$Cu^+$,Cl, $ZnGa_2S_4$:$Mn^{2+}$, ZnO:$Bi^{3+}$, BaS:Au,K, ZnS:$Pb^{2+}$, ZnS:$Sn^{2+}$,$Li^+$, ZnS:Pb,Cu, $CaTiO^3$:$Pr^{3+}$, $CaTiO_3$:$Eu^{3+}$, $Y_2O_3$:$Eu^{3+}$, $(Y,Gd)_2O_3$:$Eu^{3+}$, CaS:$Pb^{2+}$,$Mn^{2+}$, $YPO_4$:$Eu^{3+}$, $Ca_2MgSi_2O_7$:$Eu^{2+}$,$Mn^{2+}$, $Y(P,V)O_4$:$Eu^{3+}$, $Y_2O_2S$:$Eu^{3+}$, $SrAl_4O_7$:$Eu^{3+}$, $CaYAlO_4$:$Eu^{3+}$, $LaO_2S$:$Eu^{3+}$, $LiW_2O_8$:$Eu^{3+}$,$Sm^{3+}$, $(Sr,Ca,Ba,Mg)_{10}(PO_4)_6Cl_2$:$Eu^{2+}$,$Mn^{2+}$, $Ba_3MgSi_2O_8$:$Eu^{2+}$,$Mn^{2+}$, ZnS:$Mn^{2+}$,$Te^{2+}$, $Mg_2TiO_4$:$Mn^{4+}$, $K_2SiF_6$:$Mn^{4+}$, SrS:$Eu^{2+}$, $Na_{1.23}K_{0.42}Eu_{0.12}TiSi_4O_{11}$, $Na_{1.23}K_{0.42}Eu_{0.12}TiSi_5O_{13}$:$Eu^{3+}$, CdS:In,Te, $(Sr,Ca)AlSiN_3$:$Eu^{2+}$, $CaSiN_3$:$Eu^{2+}$, $(Ca,Sr)_2Si_5N_8$:$Eu^{2+}$ and $Eu_2W_2O_7$.

In addition, the design of the support of the present invention is more suitable to make using the following high-color rendering white LEDs. For example, the light emitting device includes at least one oxynitride phosphor doped with a $Mn^{2+}$ activator, where the package colloid covers the light emitting chip (i.e., the light emitting element 6), and the oxynitride phosphor is distributed in the package colloid described above. A first ray emitted by the light emitting chip will excite the oxynitride phosphor to emit a second ray. The first ray may have a luminescent spectrum ranging from 420-490 nm, and the second ray has a half-wave peak width of greater than 35 nm and less than 50 nm, and may emit a luminescent spectrum ranging from 518 nm to 528 nm, preferably 520 nm. The oxynitride phosphor may be a green phosphor, and the green phosphor is a γ-Alon oxynitride phosphor activated by $Mn^{2+}$. The chemical structure of the phosphor is represented by $M_aA_bAl_cO_dN_e$ (M includes more than one elements of Mn, Ce, Pr, Nd, Sm, Eu, Gd, Tb, Dy, Tm, and Yb, with Mn at least contained; A includes more than one metal elements other than M and Al, and in the structural formula, a+b+c+d+e=1), as the γ-Alon oxynitride phosphor activated by $Mn^{2+}$.

In order to achieve a desired white spectrum, in the light emitting device of the present invention, a red phosphor may be selected in combination with the γ-Alon oxynitride phosphor. In order to achieve a wide NTSC color gamut, it is preferable to use a fluorinated phosphor composed of $Mn^{4+}$ as an activator. The structural formula of this phosphor may be $MI_2(MII_{1-h}Mn_h)F_6$. In the above structural formula, M is at least one alkali metal element selected from Li, Na, K, Rb, and Cs. MII is at least one tetravalent metal element selected from Ge, Si, Sn, Ti, and Zr. In addition, 0.001≤h≤0.1 is preferable. In order to reduce the deterioration of light and heat caused by the fluoride phosphor, MI is preferably K, MII is preferably Ti or Si, and the concentration of $Mn^{4+}$ may be between 0.001 and 0.1. Choose the phosphor particle with an average particle size between 18 μm to 41 μm. The red phosphor specifically used in the present invention may be listed as $K_2SiF_6$:$Mn^{4+}$, $K_2TiF_6$:$Mn^{4+}$ and $K_2GeF_6$:$Mn^{4+}$; $K_2SiF_6$:$Mn^{4+}$ is preferable.

In order to improve the reliability of the light emitting device, in the present invention, for the package colloid, a moisture permeability less than 11 g/m2/24 Hr and an oxygen permeability less than 400 g/m2/24 Hr are selected; preferably, the moisture permeability less than 10.5 g/m2/24 Hr and the oxygen permeability less than 382 g/m2/24 Hr. In this embodiment, the material of the package colloid may be selected from, for example, phenyl-based silica gel or methyl-based silica gel, and the like. Furthermore, the refractive index of the package colloid is, for example, greater than 1.5; preferably, between 1.50 and 1.56.

In the description of the present invention, it is to be understood that an orientation or a positional relationship indicated by terms such as "center", "longitudinal direction", "transversal direction", "length", "width", "thickness", "up", "down", "front", "back", "left", "right", "vertical", "horizontal", "top", "bottom", "inner", "outer", etc. is based on the orientation or positional relationship shown in the drawings, which is merely for convenience and simplification of the description of the present invention, but does not indicate or imply that the indicated device or element must have a specific orientation, be configured and operated in a specific orientation, therefore, should not be construed as limiting the present invention.

In the description of the present invention, it will be appreciated that terms such as "including" and "having" and any variation thereof as used herein are intended to cover a non-exclusive inclusion, for example, processes, methods, products, or devices including a series of steps or units are not necessarily limited to those steps or units that are explicitly listed, but may include other steps or units that are not explicitly listed or inherent to these processes, methods, products, or devices.

Unless indicated or defined otherwise, terms such as "mount", "interconnection", "connect", "fixed", etc. shall be interpreted broadly and may be, for example, a secured connection, a removable connection, or to be an integration; it may be a direct connection, it also may be an indirect connection through the intermediary, it may be an interconnection inside two elements, or an interaction between the two elements. For those of ordinary skill in the art, the specific meanings of the above terms in the present invention can be understood according to specific circumstances. Moreover, terms such as "first", "second", etc. are used for descriptive purposes only, but cannot be construed as indicating or implying relative importance or implicitly indicating the number of indicated technical features.

Finally, it should be noted that the above embodiments are only used to illustrate the technical solutions of the present invention, rather than limiting them. Although the present invention has been described in detail with reference to the foregoing embodiments, those skilled in the art should understand that they may still make modifications to the technical solutions described in the foregoing embodiments or make equivalent replacement to some or all of the technical features therein; while these modifications or replacements do not make the essence of the corresponding technical solutions depart from the scope of the technical solutions of the embodiments of the present invention.

What is claimed is:

1. A package support structure, comprising:
   a housing which comprises a light emitting surface, a backlight surface, a bottom surface, a top surface, two side faces, and a groove, wherein the light emitting surface is disposed opposite to the backlight surface, the two side faces are disposed between the light emitting surface and the backlight surface, the top surface is disposed opposite to the bottom surface, the top and bottom surfaces are disposed between the light emitting surface and the backlight surface and disposed between the two side faces, wherein each side face includes a top side face portion and a bottom side face portion, the top side face portion is connected to the top surface, and the bottom side face portion is connected to the bottom surface, the top side face portion and the bottom side face portion are not aligned with each other, and the bottom side face portion is recessed relative to the top side face portion, and wherein the groove is formed on the light emitting surface and defines an opening on the light emitting surface, wherein a distance between the opening of the groove and the top surface is less than a distance between the opening of the groove and the bottom surface; and a conductive support which is partially covered by the housing and comprises a first lead and a second lead that are separated from each other, wherein each of the first lead and the second lead comprises an electrode portion and a bent portion, each electrode portion is exposed from the housing through the groove, each bent portion extends outward from the electrode portion beyond the housing and bends toward the bottom surface of the housing, and an outer side of the bent portion is disposed outside of the bottom side face portion and is aligned with the top side face portion;

wherein one of the first lead and the second lead further comprises a heat radiation portion, the heat radiation portion extends outward from the electrode portion and is exposed from the backlight surface of the housing.

2. The package support structure according to claim 1, wherein the bent portion extends outward from the heat radiation portion, such that the bent portion indirectly extends outward from the electrode portion.

3. The package support structure according to claim 1, wherein the heat radiation portion and the bent portion extend outward from opposite sides of the electrode portion, respectively.

4. The package support structure according to claim 1, wherein the housing further comprises at least one supporting portion, and the supporting portion is formed on the bottom surface; wherein the thickness of the supporting portion in a normal direction of the bottom surface is less than or equal to the thickness of the bent portion.

5. The package support structure according to claim 1, wherein one of the first lead and the second lead further comprises a sub-bent portion, the sub-bent portion extends outward from the electrode portion beyond the housing and bends toward the bottom surface of the housing; wherein the sub-bent portion is disposed between the bent portion of the first lead and the bent portion of the second lead.

6. The package support structure according to claim 1, wherein there is a gap between the first lead and the second lead, and the width of the gap is variable.

7. The package support structure according to claim 1, wherein an exposed surface of the heat radiation portion exposed on the backlight surface is aligned with the backlight surface.

8. The package support structure according to claim 1, wherein the housing further comprises at least one supporting portion, wherein the supporting portion is formed on the bottom surface of the housing, and wherein an outer side of the supporting portion is aligned with the outer side of the bent portion.

9. A light emitting device, comprising:

a package support structure which comprises a housing and a conductive support, wherein the housing comprises a light emitting surface, a backlight surface, a bottom surface, a top surface, two side faces, and a groove, the light emitting surface is disposed opposite to the backlight surface, the two side faces are disposed between the light emitting surface and the backlight surface, the top surface is disposed opposite to the bottom surface, the top and bottom surfaces are disposed between the light emitting surface and the backlight surface and disposed between the two side faces, wherein each side face includes a top side face portion and a bottom side face portion, the top side face portion is connected to the top surface, and the bottom side face portion is connected to the bottom surface, the top side face portion and the bottom side face portion are not aligned with each other, and the bottom side face portion is recessed relative to the top side face portion, wherein the groove is formed on the light emitting surface and defines an opening on the light emitting surface, wherein a distance between the opening of the groove and the top surface is less than a distance between the opening of the groove and the bottom surface, and wherein the conductive support is partially covered by the housing and comprises a first lead and a second lead that are separated from each other, each of the first lead and the second lead comprises an electrode portion and a bent portion, each electrode portion is exposed from the housing through the groove, each bent portion extends outward from the electrode portion beyond the housing and bends toward the bottom surface of the housing, and an outer side of the bent portion is disposed outside of the bottom side face portion and is aligned with the top side face portion, one of the first lead and the second lead further comprises a heat radiation portion, the heat radiation portion extends outward from the electrode portion and is exposed from the backlight surface of the housing;

a substrate which comprises a surface and a plurality of pads disposed on the surface, wherein the package support structure is disposed on the surface, and the bottom surface of the housing faces the surface, the bent portion of the first lead and the bent portion of the second lead are electrically connected to the pads, respectively;

a light emitting element which is disposed in the groove of the housing and is electrically connected to the electrode portion of the first lead and the electrode portion of the second lead; and a heat sink which is disposed on the surface and is connected to the heat radiation portion of the conductive support.

10. The light emitting device according to claim 9 further comprises a package colloid filled in the groove, wherein the package colloid covers the light emitting element, and a quantum dot material and a phosphor material are distributed in the package colloid.

11. The light emitting device according to claim 10, wherein the quantum dot material and the phosphor material are distributed in an end of the package colloid away from the light emitting element after they are subjected to an inverted centrifugation in the package colloid.

12. The light emitting device according to claim 9, wherein the substrate further comprises a supporting structure which is formed on the surface to support the light emitting surface of the housing.

13. The light emitting device according to claim 12, wherein the supporting structure is an accommodating slot or a supporting block.

14. The light emitting device according to claim 9, further comprises a light guide plate, wherein the light guide plate is disposed on the surface and comprises a light incoming side, and the light incoming side corresponds to the groove of the housing.

15. The light emitting device according to claim 9, wherein the housing further comprises at least one supporting portion, wherein the supporting portion is formed on the bottom surface of the housing, and wherein an outer side of the supporting portion is aligned with the outer side of the bent portion.

* * * * *